United States Patent [19]

Baty et al.

[11] Patent Number: 4,849,082

[45] Date of Patent: Jul. 18, 1989

[54] ION IMPLANTATION OF ZIRCONIUM ALLOYS WITH HAFNIUM

[75] Inventors: David L. Baty, Lynchburg; William C. Young, Roanoke; David E. Lewis, Forest, all of Va.

[73] Assignee: The Babcock & Wilcox Company, New Orleans, La.

[21] Appl. No.: 825,407

[22] Filed: Feb. 3, 1986

[51] Int. Cl.$^4$ ............................................. C23C 14/48
[52] U.S. Cl. .......................... 204/192.31; 204/192.16; 427/38; 250/492.1
[58] Field of Search .................... 204/157.44, 192.31, 204/192.1, 192.12, 192.15, 192.16; 250/492.3, 492.21; 148/20.3; 428/660, 661; 427/38

[56] References Cited

U.S. PATENT DOCUMENTS 3,600,797  8/1971  Bower et al. ............. 250/492.21 X
3,900,636  8/1975  Curry et al. ............. 204/192.16 X Primary Examiner—Nam X. Nguyen
Attorney, Agent, or Firm—Vytas R. Matas; Robert J. Edwards; Daniel S. Kalka

[57] ABSTRACT

An implantation method for the improvement of the corrosion resistance and hydrogen absorption resistance of zirconium alloys in a light water nuclear reactor environment includes the steps of sputtering a layer of hafnium ions onto a zirconium alloy and the implanting the hafnium ions with xenon doses of $3 \times 10^{16}$ ions/cm$^2$.

6 Claims, 2 Drawing Sheets

ION IMPLANTATION OF ZIRCONIUM ALLOYS WITH HAFNIUM

BACKGROUND

This invention relates to methods of improving the corrosion resistance of zirconium alloys used in light water nuclear reactor environments and, more particularly, to methods of implanting Zircaloy with hafnium ions to improve corrosion resistance and reduce hydrogen absorption in a light water nuclear reactor environment.

Zirconium alloys have been extensively used in nuclear reactor systems due to their optimal low neutron cross-section (low tendency to capture neutrons), generally good corrosion resistance in water and steam, and adequate strength for cladding uranium fuel used in light water reactors.

Furture reactor designs and utilizations are placing more emphasis on ensuring adequate corrosion resistance. Improvements in the corrosion resistance of the zirconium alloy, Zircaloy-4, for example, while retaining the benefits of its other favorable properties is a highly desireable goal for advanced applications.

Zircaloy-4 is an alloy composed principally of zirconium (Zr) but also containing, on a weight percent, 1.20 to 1.70% tin, 0.18 to 0.24% iron and 0.07 to 0.13% chromium.

The corrosion of Zircaloy-4 in water or steam occurs by the growth of a zirconium oxide layer produced by the reaction $Zr + 2H_2O \rightarrow ZrO_2 + 2H_2$. The growth of this layer occurs initially by either cubic or parabolic oxidation kinetics, but after a certain weight gain, the kinetics of growth are linear. The oxide film in general is quite adherent well out into the linear kinetics region. However, at a certain oxide thickness, the oxide adherency is seriously impaired and spalling or "breakaway" occurs. In nearly all present applications, the breakaway region is not reached.

During the corrosion reaction, however, hydrogen is produced. Part of this hydrogen is absorbed by the Zircaloy-4 metal while the balance is carried off in the water or steam coolant. Hydrogen absorbed by the Zircaloy-4 will eventually reach sufficient concentrations so that zirconium hydrides will form in the Zircaloy-4. The hydride formations can lead to degraded ductility and fracture toughness in the Zircaloy-4 at lower service temperature.

Improvements in the corrosion resistance can therefore occur by lowering the rate of corrosion, by eliminating the change to linear kinetics, by extending the time to film breakaway and by reducing the pick-up fraction for hydrogen in Zircaloy-4. Alloy modifications have been looked at from time to time but the generally good corrosion behavior and adequate strength of Zircaloy-2, Zircaloy-4, Zr-1Nb, Zr-2.5Nb and Ozhennite (Zr-Sn-Nb-Fe-Ni) have tended to limit any further development of commercial reactor grade alloys. However, current concerns over nodular corrosion in boiling water reactors (BWR) and over the variable corrosion resistance at extended burnup in both BWR and pressurized water reactors (PWR) generated a need to look at ways to improve existing alloy grades through modified thermomechanical processing and possibly alloy changes. Alloy modifications and thermomechanical treatments, attempted over the years to improve the corrosion resistance of Zircaloy-4 and other zirconium alloys, in general, alter either the chemistry or the structure of the entire material section, or both. This can lead to variability in the effectiveness throughout the material and alter the other properties of the alloy in an undesirable manner.

Ion implantation is generally known as an effective technique for preparing surface alloys of controlled composition without affecting the underlying bulk structure and properties of the metal. Ion implantation is the process by which sufficiently energetic ions are propelled into the surface of a host material (metal, ceramic or plastic), sometimes referred to as a matrix, such that penetration beyond surface layers occurs. This is achieved by accelerating an ion species to energies between 3 to 500 kev with resulting target penetrations to depths of 100 to 10,000 angstroms below the surface. The ion species is accelerated in vacuum through an appropriate electric potential and electromagnetically aligned and collimated to strike the material target. At low energies the ions essentially plate onto the material target and can subsequently be distributed into the target material through an inert ion (such as xenon) bombardment. At high energies, the ion species are driven into the target material creating a distribution or mixing of the implant ion with the target material.

Use of ion implantation for surface modification of surface sensitive properties of materials by changing the mechanical and chemical behavior of the surface layers is now the subject of growing research and application. Numerous surface properties of materials are influenced by surface composition. Such properties friction, wear, hardness, fatigue, corrosion, resistance, electrochemistry, catalysis, decorative finish, bonding, lubrication, adhesion and reflectance. Hence, ion implantation holds promise as a technique for altering such surface properties.

Ion implantation thus offers a method for bringing about novel surface alloy changes without altering the acceptable bulk mechanical properties of the existing zirconium alloys. Because of the potential for non-equilibrium phase structure, alloy conditions can be created which have never been evaluated before due to the nearer chemical equilibrium imposed by traditional high temperature metal processing of zirconium alloys.

SUMMARY OF THE INVENTION

In accordance with the present invention, a process of ion implantation is used to add hafnium elements to Zircaloy-4 or other zirconium based alloys to alter the surface composition and the crystalline structure of the alloy's surface.

According to one aspect of the inventive technique, hafnium is first ion plated to a thickness of 300 A. The hafnium is then bombarded with xenon ions to drive the hafnium into the Zircaloy-4 to create a hafnium alloy with the Zircaloy-4. The depth of this layer is estimated to be less than 1000 A. The desired surface concentrations are 50 atomic percent and 4 atomic percent which were approximated by xenon doses of $3 \times 10^{16}$ Xe ions/cm$^2$ and $5 \times 10^{16}$ Xe ions/cm$^2$ respectively. The xenon was accelerated to an energy of 50 keV with a beam current 0.7 to 0.8 milliamperes. After implantation a portion of the specimens were vacuum stress relief annealed at 950 F. for 2 hours.

The corrosion resistance of hafnium in high temperature water and steam is far superior than that of Zircaloy-4 and hydrogen absorption is reduced. Thus, through the use of implantation of hafnium, an improved corrosion resistant layer is imparted to the Zircaloy-4. Because of the shallowness of this modified layer none of the bulk properties of the Zircaloy-4 will be altered. The nature of the alloying created by the ion implantation cannot be created by traditional melting, hot working and heat treatment.

The various features of novelty which characterize the invention are pointed out with particularity in the claims annexed to and forming a part of this specification. For a better understanding of the invention, its operating advantages and specific objects obtained by its use, reference should be had to the accompanying descriptive matter in which there is described a preferred embodiment of the invention.

DETAILED DESCRIPTION

The present invention will now be illustrated by reference to the following specific example which is presented for the purpose of illustration only and the present invention is not intended to be limited thereto.

EXAMPLE

A layer of about 300 angstroms of hafnium was ion plated onto surface of specimens composed of a zirconium alloy (Zircaloy-4 wrought flat plate $1\frac{1}{8}$-inch $\times \frac{5}{8}$-inch $\times 3/16$-inch) by sputtering. The hafnium was then bombarded with xenon ions to drive the hafnium into the Zircaloy-4 and create a hafnium alloy with Zircaloy-4. Xenon ion doses of $3 \times 10^{16}$ and $5 \times 10^{16}$ ions/cm$^2$ were used to achieve approximate hafnium surface concentrations of 50 atomic percent and 4 atomic percent respectively. The Xenon was accelerated to an energy of 50 KeV with a beam current of 0.7 to 0.8 milliamperes.

The flat specimens were mechanically mounted using set screws in the specimen hanger holes on metal discs four inches in diameter which rotated under the specific ion beam. After the desired doses were achieved on one side, the specimens were removed and turned over to implant the other coupon face. Beam incidence was normal in these implants. The side edges of the specimens and the hole surfaces were not implanted since they were parallel to the implant beam. The implantation was performed in less than $10^{-6}$ torr Ar. The specimens could be viewed during implantation and a pale blue-violet glow emanated from the surfaces during implantation. Specimen heating occurs in an estimated temperature range of 200 to 400 degrees Fahrenheit.

After implantation, a number of the specimens were vacuum stress relief annealed at 950 degrees Fahrenheit for two hours.

After initial hafnium sputtering, the specimens had a uniform gold appearance as did the set screws holding the specimens to the disc. After subsequent sputtering the Xenon, the colors ranged from gold to metallic blue/violet as $3 \times 10^{16}$ and to light gold or straw at $5 \times 10^{16}$. Vacuum stress relief performed on half of the specimens at each dose caused the coloration to essentially disappear.

Half of the specimens for each implant condition were tested as-implanted, the other half were tested after being stress-relief annealed. Several specimens were not implanted but kept as control specimens. Half of the unimplanted control specimens were also given the stress relief anneal treatment at the same time with the selected implant specimens.

Figure 2:
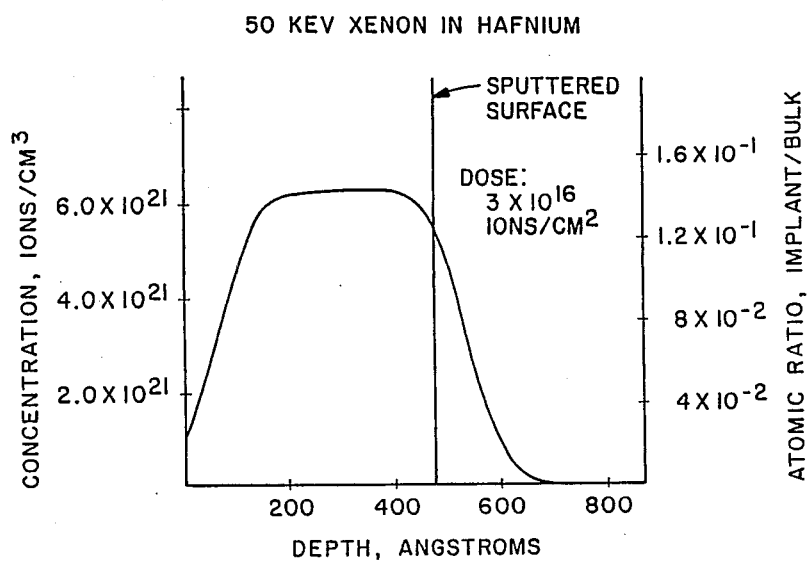
FIG. 2 graphically illustrates hafnium concentration as a function of depth in a Zircaloy-4 specimen which has been treated in accordance with the inventive techniques.

FIG. 2 illustrates hafnium concentration as a function of depth (to the right of the sputtered surface) for doses of 3 to $5 \times 10^{16}$ ions/cm$^2$ Xenon. FIG. 2 demonstrates that hafnium surface concentration will be high but that shallow penetration occurs at the lower Xenon dose of $3 \times 10^{16}$ ions/cm$^2$.

Weights and dimensions of the specimens were measured before and after implantation. The post-implantation dimensions were used for subsequent weight gain per unit surface area measurement calculations.

Corrosion effects were determined by the technique of weight gain measurement. Corrosion testing of the implanted and control specimens was performed in $750° \pm 5°$ F. steam at $1500 \pm 100$ psi. The specimens were reweighed and alcohol cleaned prior to the start of testing. The mass of each specimen is known within $\pm 0.05$ mg, which, when combined with the surface area measurement accuracy, allows the weight gain to be determined within $\pm 0.25$ mg/dm$^2$. The specimens were periodically reweighed. Weight gains per dm$^2$ were based on untested surface area dimensions. Because of the unusual color patterns observed on the specimens, color photographs of both faces were taken after each exposure.

Figure 1:
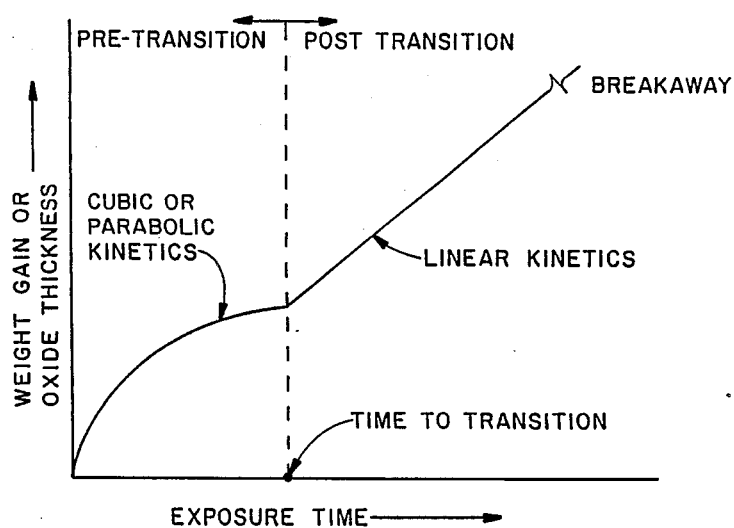
FIG. 1 is a graph which schematically illustrates weight gain or growth of the oxidation layer of a Zircaloy-4 material as a function of time before and after the transition to linear growth.

The testing schedule was designed to provide sufficient data points in the early cubic kinetics region out to about 30–35 days behavior as well as provide key comparisons with normal Zircaloy-4 behavior at 3, 7, and 14 days. The "normal" corrosion behavior in the cubic or pre-transition range, as shown by FIG. 1, was modelled. The transition from cubic to linear kinetics occurs at a weight gain of approximately 33 mg/dm$^2$ which takes about 36 days to reach in 750° F. steam for normal Zircaloy-4. The specific weight gains for each specimen were determined as a function of exposure time and are illustrated by FIGS. 3 and 4.

Figure 3:
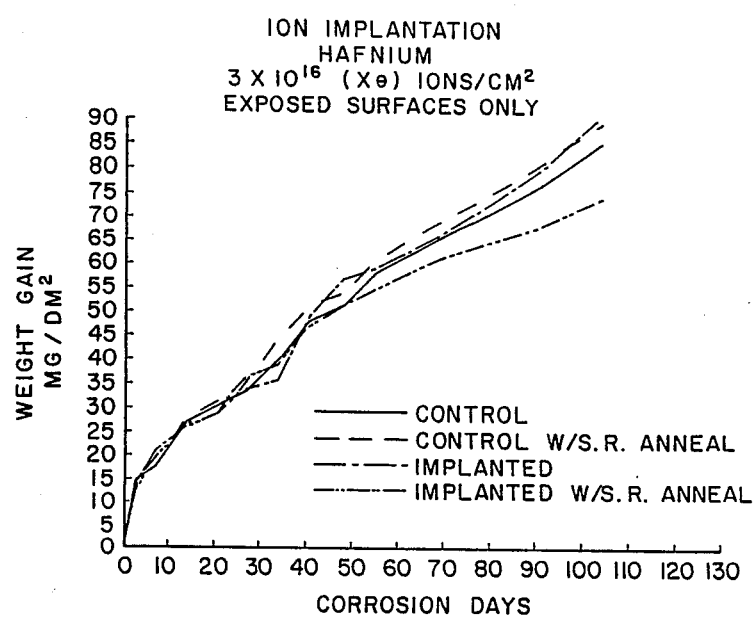
FIGS. 3 and 4 graphically illustrate corrosion weight gain of Zircaloy-4 materials which were and were not treated according to the invention. Note that the actual weight gain volume of implanted specimens is adjusted by assuming areas not implanted to have the same weight gain as the appropriate control.
Figure 4:
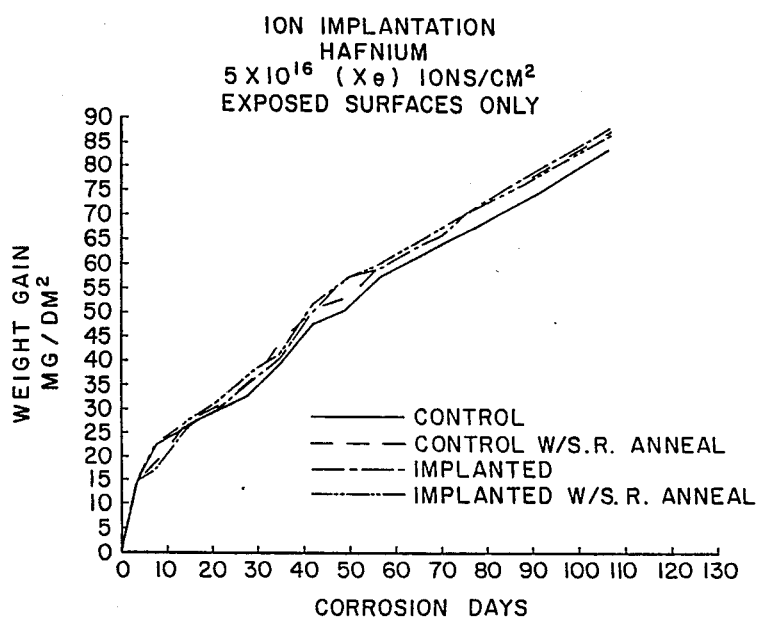

FIGS. 3 and 4 illustrate the weight gains of the Hf implants with doses of $3 \times 10^{16}$ and $5 \times 10^{16}$ ions (Xe)/cm$^2$, respectively, compared to the control specimens.

The pre-transition specific weight gains show no significant differences from the control specimens at either dose level. There also does not appear to be any difference in the time to transition to the linear kinetics region.

The post-transition linear kinetics region for the $3 \times 10^{16}$ ions(Xe)/cm$^2$ dose specimen shows some reduction in the rate of weight gain as shown in FIG. 3. This occurs only for the stress relieved implanted specimens. The slope of the specific weight gain versus time curve for this condition is 0.41 (mg/dm$^2$)/day compared to 0.61, 0.58 and 0.61 (mg/dm$^2$)/day for the as-implanted specimens, as-received control specimens, and stress relieved control specimens, respectively. No significant improvement in corrosion rate was noted for specimens with the $5 \times 10^{16}$ ions(Xe)/cm$^2$ dose.

The hafnium, in general, showed a lower hydrogen content than the control specimens. As shown in the Table, the average hydrogen content for all of the hafnium implant specimens was 29.8±4.6 ppm compared to 38.0±5.0 for the controls. When normalized for the amount of corrosion or weight gain, the hafnium implants show 0.255±0.048 ppm H/(mg/dm$^2$) compared to 0.353±0.066 ppm H/(mg/dm$^2$) for the control coupons. It also was found that the hafnium implants which were stress relieved have a lower absolute gain in hydrogen compared to as-implanted but when normalized to the overall weight gain the stress relieved specimens at $3 \times 10^{16}$ ions(Xe) no longer show any consistent trend. Thus, while no improvement in pre-transition corrosion was noted for the hafnium implants, in post-transition, a reduction in the corrosion rate of 29 to 33% was obtained with $3 \times 10^{16}$ ion/cm$^2$ dose and stress relieved coupons.

TABLE

Hydrogen Content After 105 Days

| Specimen Number | Ion | Dose, ions/cm$^2$ | Condition | Hydrogen Content ppm | Hydrogen Pick-up/ Specific Weight Gain, ppm H/(mg/dm$^2$) |
|---|---|---|---|---|---|
| 1 | Hf | $3 \times 10^{16}$ | As-implanted | 31 | 0.25 |
| 2 | Hf | $3 \times 10^{16}$ | Stress relieved | 29 | 0.28 |
| 3 | Hf | $5 \times 10^{16}$ | As-implanted | 35 | 0.30 |
| 4 | Hf | $5 \times 10^{16}$ | Stress relieved | 24 | 0.19 |
|  |  |  | Average Values: | 29.8 ± 4.6 | 0.255 ± 0.048 |
| 5 | Control | None | As-received | 43 | 0.44 |
| 6 | Control | None | As-received | 35 | 0.32 |
| 7 | Control | None | As-received | 36 | 0.34 |
| 8 | Control | None | Stress relieved | 45 | 0.43 |
| 9 | Control | None | Stress relieved | 37 | 0.31 |
| 10 | Control | None | Stress relieved | 32 | 0.28 |
|  |  |  | Average Value: | 38.0 ± 5.0 | 0.353 ± 0.066 |

The hafnium implants as a group showed a 28% reduction in the hydrogen pickup per unit weight gain.

Thus, in accordance with the invention, a process for improving the corrosion resistance and hydrogen absorption resistance of a zirconium alloy comprises the steps of depositing a layer of hafnium ions onto the surface of the zirconium alloy by sputtering, and implanting the hafnium ions into the zirconium alloy by bombarding the layer with xenon ion doses of approximately $3 \times 10^{16}$ ion/cm$^2$ at an incident energy of about 50 keV until at least an approximate hafnium surface concentration of 50 atomic percent is achieved.

We claim:

1. A process for improving the corrosion resistance and hydrogen absorption resistance of a zirconium alloy without changing the bulk properties of said alloy comprising the steps of ion plating a layer of approximately 300 Angstroms hafnium ions onto the surface of the zirconium alloy by sputtering, and driving the hafnium ions into the zirconium alloy by bombarding the layer with xenon ion doses of approximately $3 \times 10^{16}$ ions/cm$^2$ at an incident energy of about 50 keV.

2. A process as set forth in claim 1 further comprising the step of annealing the implanted zirconium alloy.

3. A process as set forth in claim 2 wherein said annealing step comprises annealing the implanted zirconium alloy in a vacuum at 950° degrees Fahrenheit for two hours.

4. A process as set forth in claim 3 wherein the alloy is Zircaloy-4.

5. A process as set forth in claim 1 wherein the alloy is Zircaloy-4.

6. A process as set forth in claim 1 wherein the bombarding of the zirconium alloy is continued until a hafnium surface concentration of at least 50 atomic percent is achieved.

* * * * *